(12) United States Patent
Tokito et al.

(10) Patent No.: US 6,337,812 B1
(45) Date of Patent: Jan. 8, 2002

(54) SEMICONDUCTOR DEVICE

(75) Inventors: Akihiro Tokito; Osamu Kuroki; Yasukazu Kai, all of Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/754,262

(22) Filed: Jan. 5, 2001

(30) Foreign Application Priority Data

Sep. 25, 2000 (JP) ............................................. 12-290627

(51) Int. Cl.[7] ................................................ G11C 7/00
(52) U.S. Cl. ............................ 365/189.05; 365/230.08; 365/189.01
(58) Field of Search ....................... 365/230.08, 230.06, 365/239, 200, 189.05, 189.01

(56) References Cited

U.S. PATENT DOCUMENTS

| | | | | |
|---|---|---|---|---|
| 5,477,488 A | * | 12/1995 | Subramani | 365/189.05 |
| 5,663,912 A | * | 9/1997 | Yamauchi | 365/189.05 |
| 5,959,900 A | * | 9/1999 | Matsubara | 365/189.05 |
| 6,023,442 A | * | 2/2000 | Haeniya | 365/189.05 |

* cited by examiner

*Primary Examiner*—Tan T. Nguyen
(74) *Attorney, Agent, or Firm*—Volentine Francos, PLLC

(57) ABSTRACT

Column signals CL1~CLm generated in a Y decoder circuit 31 are selectively output to a sub-register block 10S or a resister block 10R, based on enabling signals SEN and REN. Then, write-in data is stored in the sub-register block 10S or the resister block 10R or read-out data is obtained from the sub-register block 10S or the resister block 10R. By structuring in this way, it is possible to reduce the scale of a circuit of a semiconductor device and lessen the chip size.

13 Claims, 10 Drawing Sheets

SEMICONDUCTOR DEVICE

BACKGROUND OF THE INVENTION

1. Field of the Invention

The present invention relates to a semiconductor device, more particularly to a field memory that is used for memorizing picture data (one screen) for displaying on a display screen.

2. Description of Related Art

FIG. 2 is a block diagram showing an example of the conventional field memory.

This field memory includes a Y decoder 30S, a shift redundancy circuit 20S, and a sub-register block 10S for storing the picture data for the first row of the display screen, a memory cell block 40 for storing picture data after the second row, and so forth.

The sub-register block 10S includes m+1 registers including an auxiliary to the number m (m is an integer) of pictures for one row of the display screen. The Y decoder 30S selects one of the m column lines by decoding a column address signal ADY and outputs a column signal when an enabling signal SEN for a sub-register block is provided at the time of displaying the first row. The input side of a shift redundancy circuit 20S is connected to the m column lines. Here, the enabling signal SEN is a signal for indicating the picture element position of the picture data, and indicates the first row of the picture data as the top portion.

The shift redundancy circuit 20S corresponds between the m column lines and the m+1 registers of the sub-register block 10S. The shift redundancy circuit 20S includes a fuse group for changing connection and a switch group for changing a connection condition based on the condition of this fuse group. For the shift redundancy circuit 20S, in the condition where all the fuses are not cut off, each of the first to m-th input sides is connected to each of the first to m-th output sides. Further, when an i-th (i is a positive integer below m) fuse is cut off, each of the first to i−1-th input sides is connected to each of the first to i−1-th output sides in a direct manner, and each of the i-th to m-th input sides is connected to each of the i+1 to m+1-th output sides by shifting one respectively. Accordingly, when the i-th register of the sub-register block 10S is broken, the broken fuse can be disregarded by cutting off the i-th fuse of the shift redundancy circuit 20S.

On the other hand, the memory cell block 40 memorizes the picture data of the second to n-th (n is a positive integer greater than 2) row. The memory cell block 40 is composed of n−1 word lines arranged in a parallel way, m+1 bit lines arranged in a crossing way thereto, and respective memory cells arranged in respective crossing points between such respective word lines and such bit lines. The word line of the memory cell block 40 is connected to an X decoder 50 that decodes a row address signal ADX and drives the corresponding word line. For the memory cell block 40, when one word line is driven by the X decoder 50, each of the m+1 memory cells corresponding thereto is selected and connected to each corresponding bit line.

The resister block 10R is connected to the m+1 bit lines of the memory cell block 40 using a sense amplifier block 60. A sense amplifier block 60 amplifies a tiny potential difference, which is output to respective bit lines from the memory cell of the memory cell block 40 at the time of a read-out operation, until the predetermined logical level is attained. The resister block 10R temporarily memorizes data, which is read and/or written to the memory cell of the memory cell block 40, one line at a time. In the same way as the sub-register block 10S, the column signal is provided to the resister block 10R based on the column address signal ADY from a Y decoder 30R using a shift redundancy circuit 20R.

A read write (R/W) buffer 70S that performs write-in or read-out to a register, which is selected sequentially by the column signal, is connected to the sub-register block 10S. In the same way, a read write buffer 70R that performs write-in or read-out to a register, which is selected sequentially by the column signal, is connected to the register block 10R. The read write buffers 70S and 70R are connected to selectors 80 and 90. As a result, write-in data DTW is provided from the outside through the selector 80, and read-out data DTR is output to the outside through the selector 90.

In such a field memory, it is tested whether or not write-in or read-out is performed to the sub-register block 10S register at the stage of manufacturing and it is checked whether or not a failure condition has occurred. If the failure register is found in the checked registers, the fuse corresponding thereto of the shift redundancy circuit 20S is cut off and then the failure register thereof is eliminated. Further, it is tested whether or not write-in or read-out is performed to the memory cell of the memory cell block 40 and it is checked whether or not the failure has occurred. If the failure memory cell is found in the memory cell block, the fuse corresponding thereto of the shift redundancy circuit 20R is cut off and the failure memory cell thereof is then eliminated.

In this field memory, the data write-in is performed in the following way. When m data of the first column of the display screen is written in, the selector 80 is switched towards the read write buffer 70S. Further, the enabling signal SEN for the sub-register block is provided to the Y decoder 30S, the column address signal ADY is decoded by this Y decoder 30S, and then the column signal is provided to the sub-register block 10S by way of the shift redundancy circuit 20S.

On the other hand, the write-in data DTW is provided to the sub-register block 10S by way of the selector 80. Accordingly, the write-in data DTW provided to the column address signal ADY in a synchronizing manner is written sequentially in respective registers of the sub-register block 10S.

When the data after the second row of the display screen is written in, the selector 80 is switched towards the read write buffer 70R. Further, the enabling signal REN for the register block is provided to the Y decoder 30R, the column address signal ADY is decoded by this Y decoder 30R, and then the column signal is provided to the resister block 10R using the shift redundancy circuit 20R. The enabling signal REN is a signal for indicating the picture element position of the picture data and indicates the picture data other than the top position, namely after the second row.

On the other hand, the write-in data DTW is provided to the resister block 10R through the selector 80. Accordingly, the write-in data DTW that is provided by synchronizing with the column address signal ADY is written sequentially in respective registers of the resister block 10R. When the write-in data DTW for one row is stored in respective registers of the resister block 10R, the contents of respective registers of this resister block 10R are output to the memory cell block 40 by way of the sense amplifier block 60 and the bit lines. Accordingly, the write-in data DTW for one row is written simultaneously in the memory cell connected to the word line selected by the X decoder 50.

Further, in this field memory, the data read-out is performed in the following way. When m data of the display screen is read out, the selector 90 is switched towards the read write buffer 70S. Further, the enabling signal SEN is provided to the Y decoder 30S, the column address signal ADY is decoded by this Y decoder 30S, and then the column signal is provided to the 30 sub-register block 10S using the shift redundancy circuit 20S.

Accordingly, the contents of respective registers of the sub-register block 10S are readout sequentially by synchronizing with the column address signal ADY, and then the read-out data DTR is output from the selector 90.

When the data after the second row of the display screen is read out, the selector 90 is switched towards the read write buffer 70R. Further, the contents of the memory cell for one row connected to the word line selected by the X decoder 50 are output simultaneously to the resister block 10R using the bit line and the sense amplifier block 60. Furthermore, the enabling signal REN is provided to the Y decoder 30R, the column address signal ADY is decoded by this Y decoder 30R, and then the column signal is provided to the resister block 10R using the shift redundancy circuit 20R. Accordingly, the data for one row read out in the resister block 10R from the memory cell block 40 are read out sequentially in the read write buffer 70R by synchronizing with the column address signal ADY, and output from the selector 90 as the read-out data DTR.

However, according to the conventional field memory, two sets of the Y decoders 30S and 30R and shift redundancy circuits 20S and 20R have been required to corresponding the sub-register block 10S and the resister block 10R, and thus there has been a problem, in which the scale of the circuit has become large.

The present invention solves the problem which the above-mentioned technology has, and provides the field memory in which the scale of the circuit is simplified.

SUMMARY OF THE INVENTION

Here, all of the necessary characteristics which the present invention requires are not disclosed in the summary of the invention, but sub-combinations of these characteristics can also be the present invention.

In order to attain the above-mentioned object, a semiconductor device includes a first register for enabling a predetermined part of the picture data composed of a plurality of bits to be stored corresponding to a first selection signal; a memory array cell, which includes a plurality of memory cells being arranged in a matrix way in row and column directions, for storing a residual part of the picture data; a second register for enabling data that is stored in the memory cell array to be output or for enabling data being output from the memory cell array to be stored corresponding to a second selection signal; and a control circuit for selectively generating and outputting the first selection signal or the second selection signal based on position information of the picture data.

The above-mentioned object can be attained by composing in this way.

Further, the semiconductor device of the present invention includes a first register for enabling a predetermined part of the picture data composed of a plurality of bits to be stored corresponding to decoding information and a first selection signal for indicating position information of the picture data; a memory array cell, which includes a plurality of memory cells being arranged in a matrix way in row and column directions, for storing a residual part of the picture data; a second register for enabling data being stored in the memory cell array to be output or data being output from the memory cell array to be stored corresponding to the decoding information and a second selection signal for indicating another position information of the picture data; and a decode circuit for generating and outputting decoding information by decoding address information.

The above-mentioned object can also be attained by composing in this way.

Another semiconductor device of the present invention includes a first register for enabling a predetermined part of the picture data composed of a plurality of bits to be stored corresponding to decoding information and a first selection signal for indicating position information of the picture data; a memory array cell, which includes a plurality of memory cells being arranged in a matrix way in row and column directions, for storing a residual part of the picture data; a second register for enabling data being stored in the memory cell array to be output or data being output from the memory cell array to be stored corresponding to the decoding information and a second selection signal for indicating another position information of the picture data; and a control circuit for selectively generating the first selection signal or the second selection signal based on position information of the picture data and for outputting generated selection signals corresponding to a clock signal synchronizing with the picture data.

The above-mentioned object can also be attained by composing in this way.

BRIEF DESCRIPTION OF THE DRAWINGS

While the specification concludes with claims particularly pointing out and distinctly claiming the subject matter which is regarded as the invention, it is believed that the invention, the object, features and advantages thereof will be better understood from the following description taken in connection with the accompanying drawings in which:

DETAILED DESCRIPTION OF THE INVENTION

The invention will now be described based on the preferred embodiments. This does not intend to limit the scope of the present invention, but rather exemplify the invention. All of the features and the combinations thereof described in the embodiments are not necessarily essential to the invention.

(Fist Embodiment)

Figure 1:
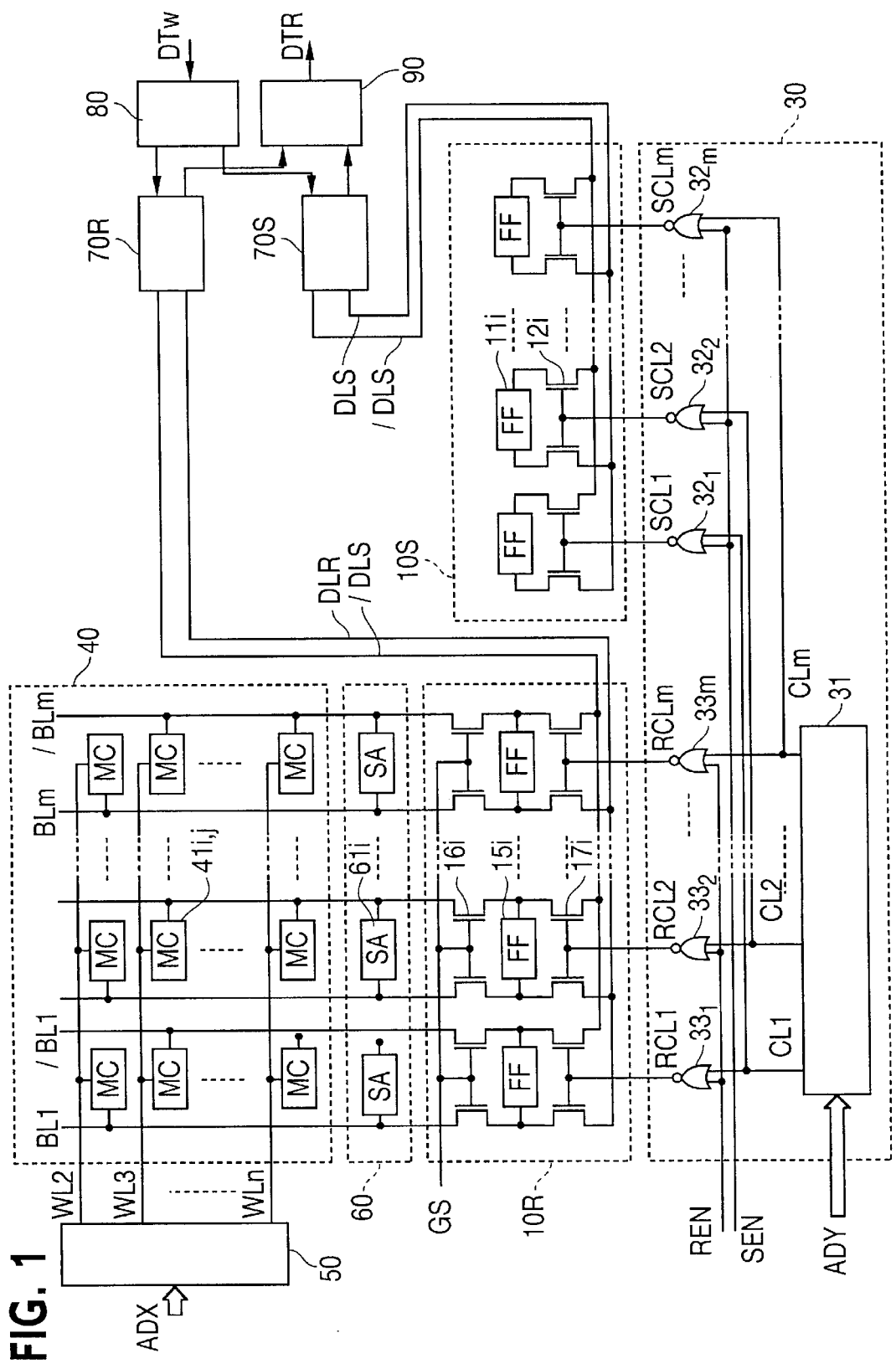
FIG. 1 is a block diagram showing a field memory of the first preferred embodiment of the present invention.
Figure 2:
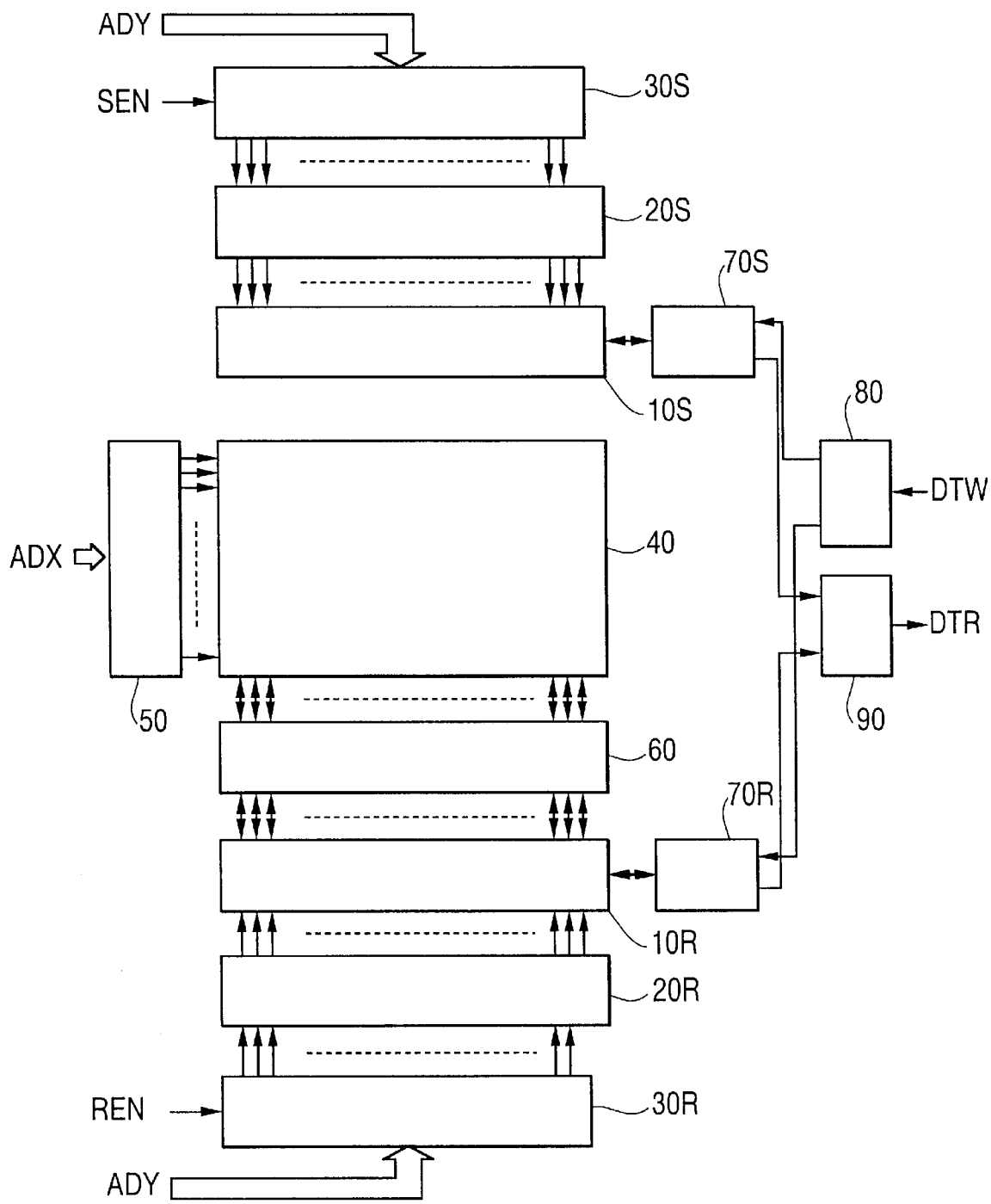
FIG. 2 is a block diagram of the conventional field memory.

FIG. 1 is a block diagram of a field memory of the first preferred embodiment of the present invention. The same numerals are given to the same elements that are common to the elements of FIG. 2.

This field memory is a memory for storing picture data of a display screen having m picture elements in the horizontal direction and n picture elements in the vertical direction, and includes a sub-register block 10S for storing the picture data of the first row and a memory cell block 40 for storing respective picture data of the second to n-th rows. The picture data is composed of a plurality of bits, and each bit data corresponds to each picture element.

The sub-register block 10S includes m flip-flops (hereinafter "FF") $11_i$ (i=1~m), which corresponds to m, the number of picture elements of one row of the display screen. Each FF $11_i$ is connected to each common data line DLS and /DLS (here, "/" means inversion) by way of a transistor $12_i$ for switching, and further, such data lines DLS and /DLS are connected to a read write buffer 70S.

On the other hand, a memory cell block 40 is composed of m pairs of bit lines BLi and /BLi arranged in a parallel way, n−1 word lines WLj (j=2~n) arranged in a crossing way therewith, and memory cells (MC) $41_{i,j}$ arranged in each crossing point between these bit lines and word lines. In the memory cell block 40, if the word line WLj is selected, m memory cells (MC) $41_{i,j}$~$41_{m,j}$ for one row corresponding thereto are selected and connected to corresponding bit lines BLi and /BLi respectively. The word line WLj of the memory cell block 40 is connected to an X decoder 50 that decodes a row address signal ADX and drives a word line corresponding thereto.

The m pairs of bit lines BLi and /BLi of the memory cell block 40 are connected to a resister block 10R by way of a sense amplifier block 60. The sense amplifier block 60 is composed of sense amplifiers (SA) $61_i$ connected to respective bit lines BLi and /BLi. The sense amplifier block 60 amplifies micro-voltage, which is output to each bit line BLi and /BLi from the memory cells (MC) $41_{i,j}$ of the memory cell block 40 when the read-out operation is performed, until the predetermined logical level is attained.

A register block 10R stores data temporarily one row at a time, which is read and written to the memory cells (MC) $41_{i,j}$ of the memory cell block 40. The resister block 10R includes FF $15_i$ corresponding to respective bit lines BLi and /BLi. Respective FF $15_i$ and the bit lines BLi and /BLi are connected by way of a transistor $16_i$ for switching. Further, FF $15_i$ is connected to common data lines DLR and /DLR by way of a transistor $17_i$ for switching. Further, such common data lines DLR and /DLR are connected to the read write buffer 70R.

This field memory connects FF $11_i$ within a sub-register block 10S to the data lines DLS and /DLS in a sequential manner based on a column address signal ADY, and further includes a Y decoder circuit 30 for connecting FF $15_i$ within the resister block 10R to the data lines DLR and /DLR in a sequential manner.

The Y decoder circuit 30 includes a Y decoder circuit 31 for only driving a column signal CLi, which corresponds to the column address signal ADY among m column signals CL1~CLm, until a logical level turns to be an "L" level (equivalent to a ground voltage level as a voltage level) and of driving others until the logical level turns to be an "H" level (equivalent to an electric power source voltage level as a voltage level). Each of the column signals CL1~CLm of the Y decoder circuit 31 is connected to the first input side of the negative logical sum gates (hereinafter "NOR") $32_1$~$32_m$, each of which has 2 inputs, and are further connected to the first input side of NORs $33_1$~$33_m$ having 2 inputs.

An enabling signal SEN for the sub-register block, which is driven to the "L" level at the time of selecting the sub-register block 10S, is applied commonly to the second input side of NORs $32_1$~$32_m$. Further, the output side of respective NORs $32_1$~$32_m$ is connected to a gate of associated transistors $12_1$~$12_m$ of the sub-register block 10S. Further, an enabling signal REN for the sub-register block, which is driven to the "L" level at the time of selecting the resister block 10R, is applied commonly to the second input side of NORs $33_1$~$33_m$. Further, each output side of NORs $33_1$~$33_m$ is connected to each gate of associated transistors $17_1$~$17_m$ of the resister block 10R.

Each of the read write buffers 70S and 70R reads and writes data between data lines DLS and /DLS and data lines DLR and /DLR. The read write buffers 70S and 70R are connected to selectors 80 and 90. As a result, write-in data DTW are provided from the outside through the selector 80, and read-out data DTR are output to the outside through the selector 90.

Figure 3:
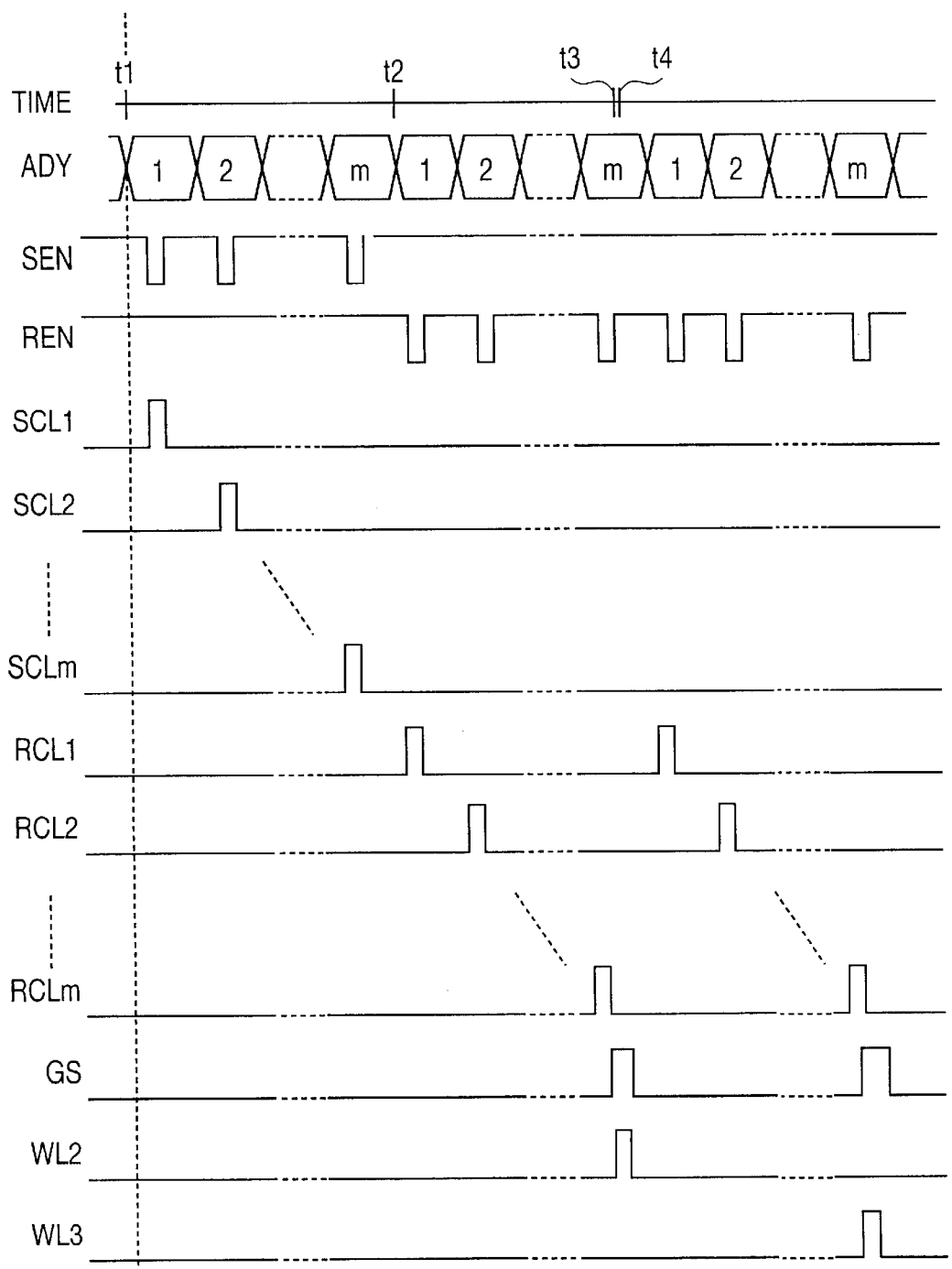
FIG. 3 is a timing chart showing an operational function of the field memory of FIG. 1.

FIG. 3 is a signal wave chart (timing chart) showing the operation of FIG. 1.

Next, the operation of writing data in the field memory of FIG. 1 is explained with reference to FIG. 3.

At the time t1 of FIG. 3, when it starts to write m data of the first row, the selector 80 is switched to the side of the read write buffer 70S. In the Y decoder circuit 30, the column address signal ADY is provided, which is counted sequentially in the range of 1 to m with a predetermined period, and the enabling signal SEN, which becomes the "L" level with a predetermined pulse width, at the time that the column address signal ADY thereof is established. Further, the enabling signal REN is fixed to the "H" level.

Accordingly, each of column signals SCL1~SCLm, which become the "H" level for a predetermined period at the time that the enabling signal SEN becomes to the "L" level, for the sub-register block is output sequentially from each of the NORs $32_1$~$32_m$ with the predetermined period. The column signals SCL1~SCLm are provided to the sub-register block 10S, and controlled so that the transistors $12_1$~$12_m$ for switching become the ON condition sequentially. During this operation, column signals RCL1~RCLm, which are output from NORs $33_1$~$33_m$, for the register block are fixed to the "L" level, and the transistors $17_1$~$17_m$ of the resister block 10R become the OFF condition at all times.

On the other hand, write-in data DTW provided to the selector 80 from the outside is output to the data lines DLS and /DLS by way of the read write buffer 70S. Further, at the time that the column signal SCLi becomes the "H" level, the write-in data DTW of the data lines DLS and /DLS is kept in FF $11_i$. In this way, the write-in data DTW provided to the column address signal ADY in a synchronizing manner are sequentially written in FFs $11_1$~$11_m$ within the sub-register block 10S.

At the time t2, when the data of the second row is written, the selector 80 is switched to the side of the read write buffer 70R. Successively from the previous duration, the column address signal ADY, which is counted sequentially in the range of 1 to m with a predetermined period, and the enabling signal REN, which becomes the "L" level with a predetermined pulse width at the time that the column address signal ADY thereof is established, is provided to the Y decoder circuit 30. Further, the enabling signal SEN is fixed to the "H" level.

Accordingly, at the time that the enabling signal REN becomes the "L" level, the column signals RCL1~RCLm, which becomes the "H" level for the predetermined period, are output sequentially from NORs $33_1$~$33_m$ at a predetermined period. The column signals RCL1~RCLm are provided to the resister block 10R, and controlled in order for the transistors $17_1$~$17_m$ for switching to be the ON condition. During this operation, the column signals SCL1~SCLm output from the NORs $32_1$~$32_m$ are fixed to the "L" level, and the transistors $12_1$~$12_m$ of the sub-register block 10S are set to the OFF condition.

On the other hand, the write data DTW provided to the selector 80 from the outside are output to the common data lines DLR and /DLR by way of the read write buffer 70R. In addition, at the time that the column signal RCLi becomes the "H" level, the write-in data DTW of the data lines DLR and /DLR are kept in FF $15_i$. In this way, the write-in data DTW provided to the column address signal ADY in a synchronizing manner is sequentially written in FFs $15_1$~$15_m$ within the sub-register block 10R.

At the time t3, when the write data DTW for one row is written in each of FFs $15_1$~$15_m$ within the resister block 10R, a gate signal GS having the predetermined pulse width is provided from a control circuit, not shown in the drawing, and then the transistors $16_i$~$16_m$ for switching are set to the ON condition at the same time. Accordingly, each of FFs $15_1$~$15_m$ within the resister block 10R are connected to each bit line BL1 and /BL1~BLm and /BLm corresponding thereto.

At the time t4, the row address signal ADX for indicating the second row is provided to the X decoder 50, and thus the word line WL2 is selected by this X decoder 50. In this way, each of the write-in data DTW for one row, which is stored in FFs $15_1$~$15_m$, of the display screen is written to each of the memory cells $41_{2,i}$~$41_{2,m}$ connected to the word line WL2 selected by the X decoder 50 at the same time. In addition, the same write-in operation is performed to the memory cell of the third to n-th row of the memory cell block 40 in a repetitive manner.

Here, the operation in which the data is read out is nearly equal to the operation in which the data is written in. Namely, when m data of the first row is readout, the selector 90 is switched to the side of the read write buffer 70S. Further, for the Y decoder circuit 30, the column address signal ADY which counts from 1 to m at a predetermined period, the enabling signal SEN which becomes the "L" level with the predetermined pulse width when this column address signal ADY is established, and the enabling signal REN which is fixed to the "H" level are provided. In this way, the contents of FFs $11_1$~$11_m$ within the sub-register block 10S are sequentially read out in a synchronizing manner, and output as the read-out data DTR from the selector 90.

When the data after the second row is read out, the selector 90 is switched to the side of the read write buffer 70R. Further, the contents of the memory cell for one row, which is connected to the word line WLj selected by the X decoder 50, are amplified by each sense amplifier $60_i$ of the sense amplifier block 60 until the predetermined logical level is attained, and then output to each of the bit lines BLi and /BLi. In addition, each signal of the bit lines BLi and /BLi is provided to each of FFs $15_1$~$15_m$ within the resister block 10 by the gate signal GS at the same time and kept therein.

On the other hand, there are provided to the Y decoder circuit 30, successively from the previous period, the column address signal ADY sequentially counted from 1 to m at a predetermined period and, in addition thereto, the enabling signal REN which besomes the "L" level with the predetermined pulse width at the time of establishing the column address signal ADY and the enabling signal SEN fixed to the "H" level. In this way, the data for one row, which is stored in FFs $15_1$~$15_m$ within the resister block 10R, is sequentially read out by synchronizing with the column address signal ADY and output as the read-out data DTR from the selector 90.

In this way, the field memory of the first preferred embodiment gives the column signals CL1~CLm output from one of the Y decoder circuit 31 to the sub-register block 10S and the resister block 10R by controlling the enabling signals SEN and REN. Accordingly, it is not necessary to install a separate Y decoder in the sub-register block 10S and the resister block 10R, and thus an advantageous point in which it is possible to simplify the scale of the circuit can be obtained.

(Second Embodiment)

Figure 4:
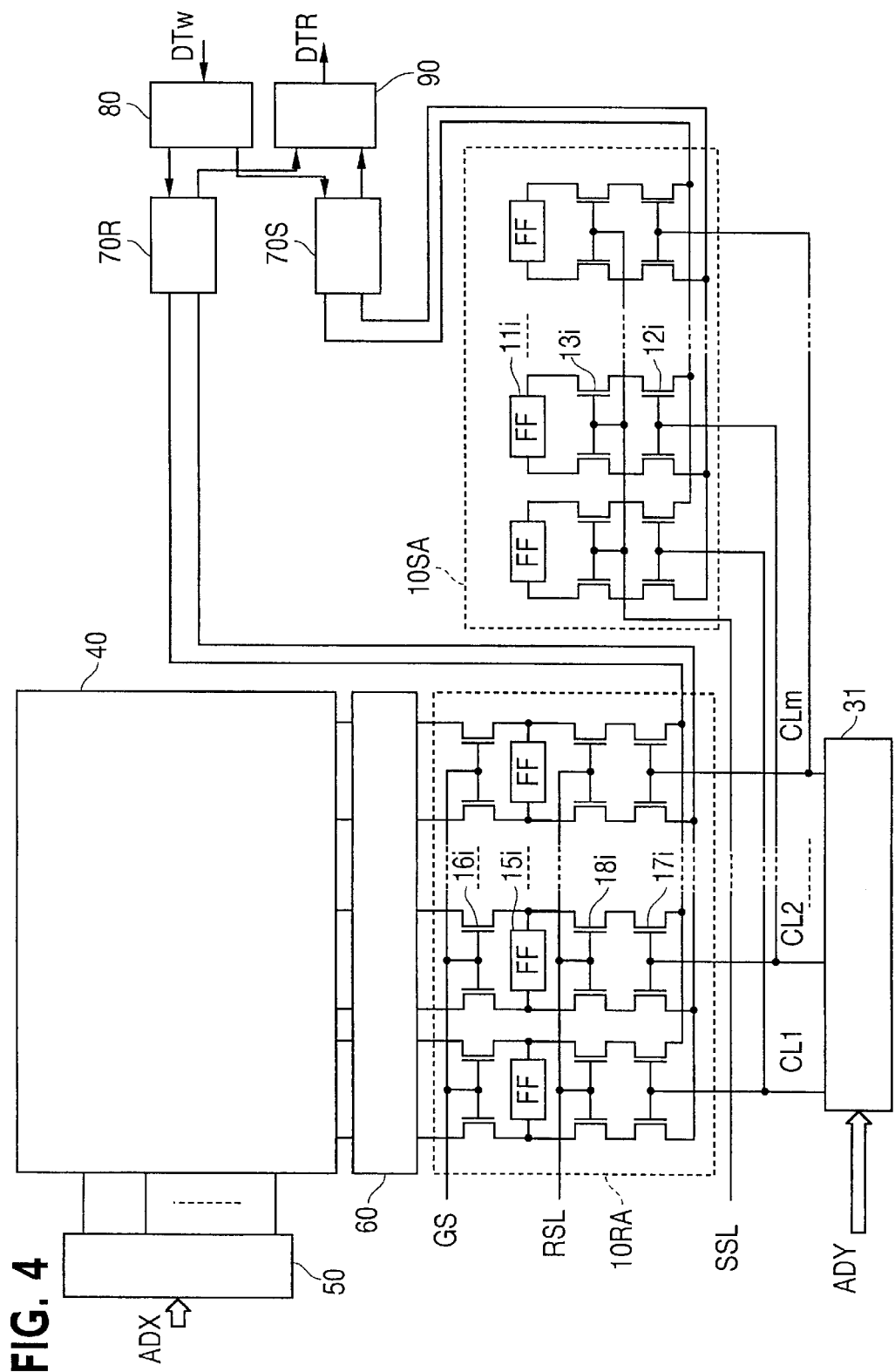
FIG. 4 is a block diagram of the field memory of the second preferred embodiment of the present invention.

FIG. 4 is a component diagram of the field memory showing the second preferred embodiment of the present invention. Here, the common numeral is given to the common element to the element of FIG. 1.

In this field memory, instead of the sub-register block 10S and the resister block 10R of FIG. 1, a resister block 10RA and a sub-register block 10SA which have different components therefrom are installed, and further the Y decoder circuit 31 is solely utilized instead of the Y decoder circuit 30.

The sub-register block 10SA is an element in which a transistor $13_i$, which is ON/OFF controlled by a selection signal SSL for the sub-register block, for switching is installed between each FF $11_i$ and each transistors $12_i$. In the same way, the register block 10RA is an element in which a transistor $18_i$, which is ON/OFF controlled by a selection signal RSL for the register block, for switching is installed between each FF $15_i$ and each transistors $17_i$.

Further, each transistor $12_i$ of the sub-register block 10SA and each transistor $17_i$ of the resister block 10RA are ON/OFF controlled by the column signal CLi output from the Y decoder circuit 31.

In such a field memory, when the data for the first row is read and/or written, the selection signal SSL for selecting the sub-register block 10SA is set to the "H" level. Further, when the data for the second to n-th rows is read and/or written, the selection signal RSL for selecting the register block 10RA is set to the "H" level. Other than this, the operation is the same as the field memory of FIG. 1.

In this way, the field memory of the second preferred embodiment, instead of NORs $32_i$ and $33_i$ of the first preferred embodiment, transistors $13_i$ and $18_i$ for switching are provided within the sub-register block 10SA and the resister block 10RA in order to perform the same function. In this way, the same advantageous point as the first preferred embodiment can be attained.

(Third Embodiment)

Figure 5:
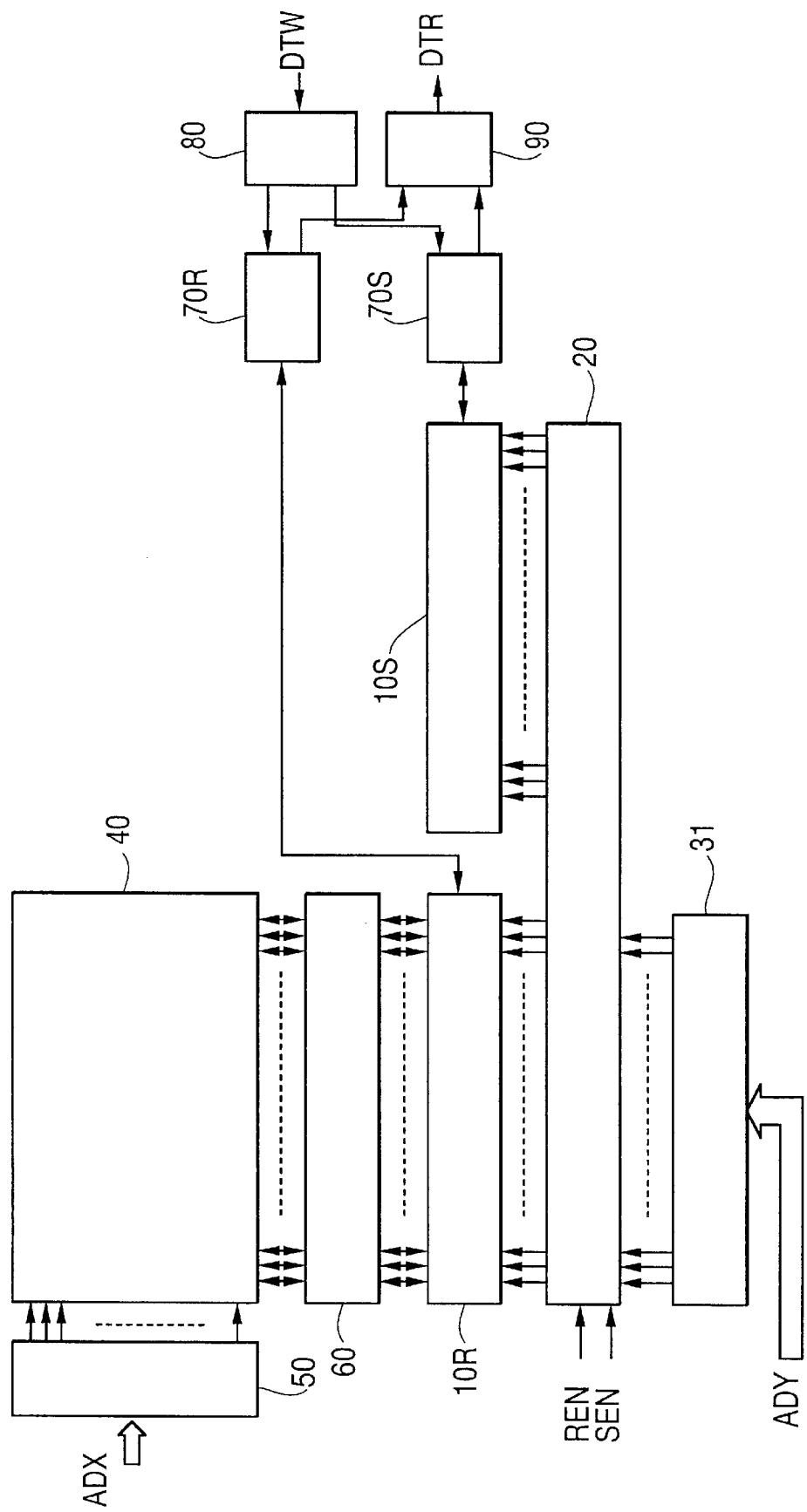
FIG. 5 is a block diagram of the field memory of the third preferred embodiment of the present invention.

FIG. 5 is a block diagram of the field memory showing the third preferred embodiment of the present invention. Here, in FIG. 5, the common numeral is given to the common element to the elements of FIG. 1.

This field memory, instead of the Y decoder circuit 30 of FIG. 1, a shift redundancy circuit 20 and the Y decoder circuit 31 are provided. Here, each of the sub-register block 10S, the resister block 10R, the memory cell block 40, and the sense amplifier block 60 includes m+1 circuits including an auxiliary circuit for one row in order to correspond to the shift redundancy circuit 20.

Figure 6:
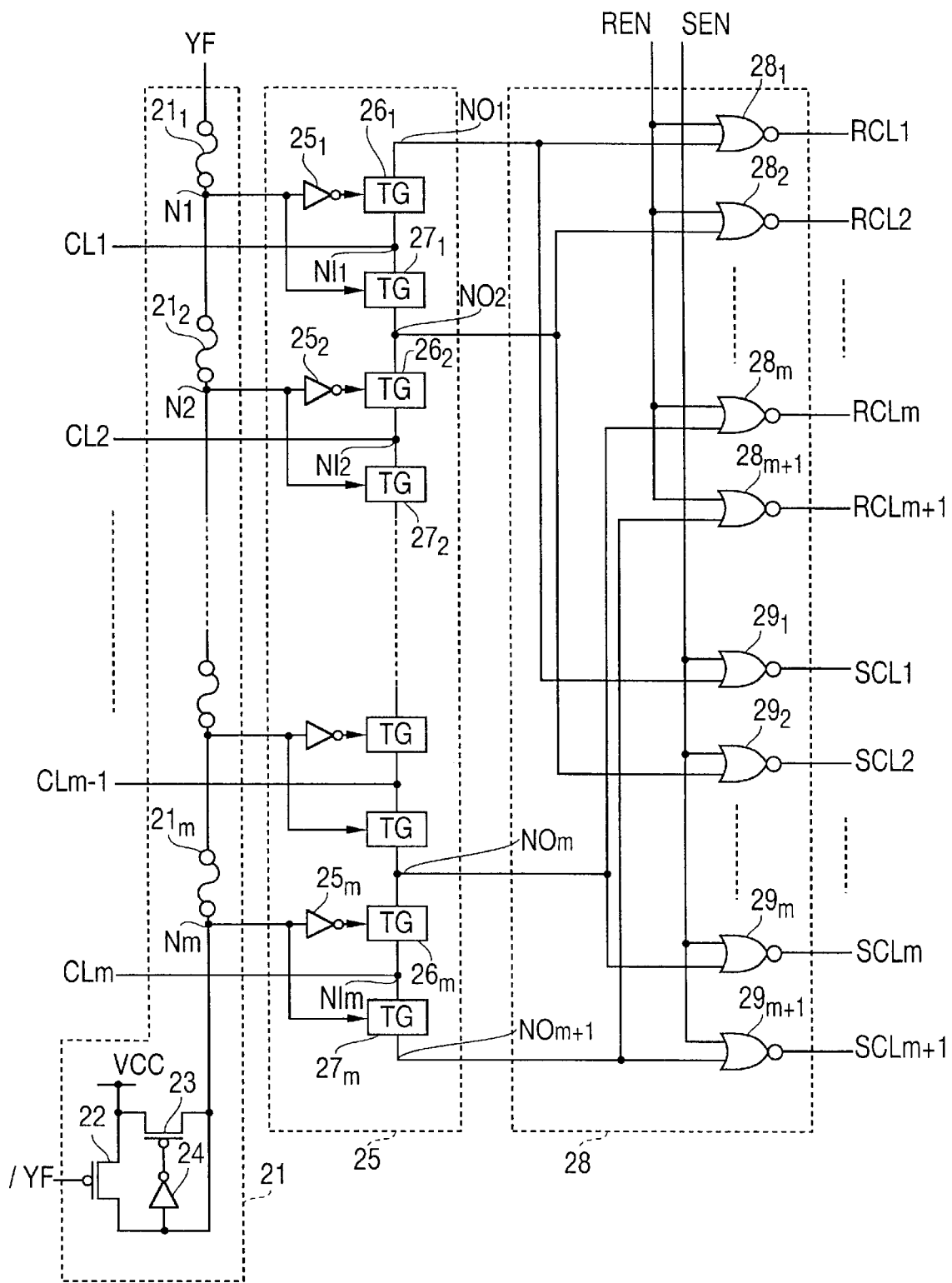
FIG. 6 is a block diagram of a shift redundancy circuit of FIG. 5.

FIG. 6 is a block diagram of the shift redundancy circuit of FIG. 5.

The shift redundancy circuit 20 includes a setting unit 21 for setting to separate a failure circuit, a switching unit 25 for switching the destination for outputting the column signals CL1~CLm output from the Y decoder circuit 31 based on the setting unit 21, and a driving unit 28 for outputting a column signal to the resister block 10R and the sub-register block 10S.

The setting unit 21 includes m fuses $21_1$~$21_m$ connected in a sequential series by way of control nodes N1~Nm and a signal YF is provided to one end of the fuses $21_1$. On the other hand, the other end of the fuse $21m$, namely the control node Nm, is connected to an electric power supply VCC by way of P-channel MOS transistors(hereinafter "PMOS") 22 and 23. Electric potential having a reverse polarity of the nodes Nm is applied to the gate of the PMOS 23 byway of an inverter 24, and a signal /YF is provided to the gate of the PMOS 22.

The switching unit 25 includes m input nodes NI1~NIm to which respective column signals CL1~CLm are provided from the Y decoder circuit 31 and m+1 output nodes NO1~NOm+1 from which such column signals CL1~CLm are switched and output. The input node NIi and the output node NOi (i=1~m) are connected by a transfer gate (hereinafter "TG") $26_i$. Electric voltage of a control node Ni of the setting unit 21 is provided to the control terminal of the TG $26_i$ by way of an inverter $25_i$.

Further, the input nodes NIi and the output node NOi+1 are connected by TG $27_i$. Electric voltage of the control node Ni of the setting unit 21 is provided to the control terminal of TG $27_i$ with no changes. These TGs $26_i$ and $27_i$ are set to the ON condition when a signal having the "H" level is applied to the control terminal and set to the OFF condition when a signal having the "L" level is applied.

The driving unit 28 includes m+1 NORs $28_1$~$28_{m+1}$ gate-controlled by the enabling signal REN for the register block and m+1 NORs $29_1$~$29_{m+1}$ gate-controlled by the enabling signal SEN for the sub-register block. Each second input side of the NORs $28_1$~$28_{m+1}$ and the NORs $29_1$~$29_{m+1}$ is connected to each of the output nodes NO1~NOm+1 of the switching unit 25. Further, each of the column signals RCL1~RCLm+1 for the register block is output from each output side of the NORs $28_1$~$28_{m+1}$ and supplied to the switching transistor of the resister block 10R. Furthermore, each of the column signals SCL1~SCLm+1 for the sub-register block is output from each output side of the NORs $29_1$~$29_{m+1}$ and is provided to the switching transistor of the sub-register block 10S.

Next, the function of the shift redundancy circuit thereof is explained hereinafter.

In such a case that all of the fuses $21_1$~$21_m$ of the setting unit 21 are not cut off, all of the control nodes N1~Nm become the "L" level by setting the signal YF to the "L" level. Thus, TGs $26_1$~$26_m$ of the switching unit 25 are set to the ON condition, and TGs $27_1$~$27_m$ are set to the OFF condition. Thus, the column signals CL1~CLm provided from the Y decoder circuit 31 are output to the output nodes NO1~NOm through the input nodes NI1~NIm and the TGs $26_1$~$26_m$ respectively. The column signals CL1~CLm output to the output nodes NO1~NOm are gate-controlled by the enabling signal REN in NORs $28_1$~$28_m$ of the driving unit 28 and output as the column signals RCL1~RCLm. In the same way, the column signals CL1~CLm output to the output nodes NO1~NOm are gate-controlled by the enabling signal SEN in the NORs $28_1$~$28_m$, and output as the column signals SCL1~SCLm.

On the other hand, when the fuse $21k$ (k=1~m) of the setting unit 21 is cut off, the control nodes N1~Nk-1 (here, k≠1) become the "L" level by setting the signal YF to the "L" level, and thus the control nodes Nk~Nm become "H" level. Accordingly, TGs $27_k$~$27_m$ and TGs $26_1$~$26_{k-1}$ of the switching unit 25 become the ON condition. Thus, the column signals CL1~CLk-1 provided from the Y decoder circuit 31 are output to the output nodes NO1~NOk-1 through the input nodes NI1~NIk-1 and TGs $26_1$~$26_{k-1}$ respectively. Further, the column signals CLk~CLm are output to the output nodes NOk+1~NOm+1 through the input nodes NIk~NIm and TGs 27k~26m respectively.

The column signals CL1~CLk-1 output to the output nodes NO1~NOk-1 are gate-controlled by the enabling signal REN in the NORs $28_1$~$28_{k-1}$ of the driving unit 28, and output as the column signals RCL1~RCLk-1. Further, the column signals CLk~CLm output to the output nodes NOk+1~NOm+1 are gate-controlled by the enabling signal REN in the NORs $28_{k+1}$~$28_{m+1}$ of the driving unit 28, and output as the column signals RCLk+1~RCLm+1.

In the same way, the column signals CL1~CLm are gate-controlled by the enabling signal SEN in NORs $28_1$~$28_{k-1}$ and $28_{k+1}$~$28_{m+1}$, and output as the column signals SCL1~SCLk-1 and SCLk+1~SCLm+1.

In this way, the shift redundancy circuit 20 is capable of individually carrying down the column signals RCLi and SCLi after the k-th order by cutting off the fuse $21k$. Accordingly, if there is a failure condition in the bit line, FF, the sense amplifier, or the memory cell of the k-th column, it is possible to use the auxiliary circuit which is prepared in the m+1-th column by removing the failure portion by cutting off the fuse $21k$ in advance.

Here, the shift redundancy circuit 20 thereof is set in the stage of manufacturing, thus the function of the field memory which has been made up as a product is the same as the field memory of FIG. 1.

In this way, the field memory of the third preferred embodiment includes the common shift redundancy circuit 20 to the sub-register block 10S and the resister block 10R. Thus, an advantageous point can be obtained, in which there is no need for providing a separate shift redundancy circuit in the sub-register block 10S and the resister block 10R and thus the scale of the circuit, including the shift redundancy circuit, can be simplified in the same way as the first preferred embodiment.

(Fourth Embodiment)

Figure 7:
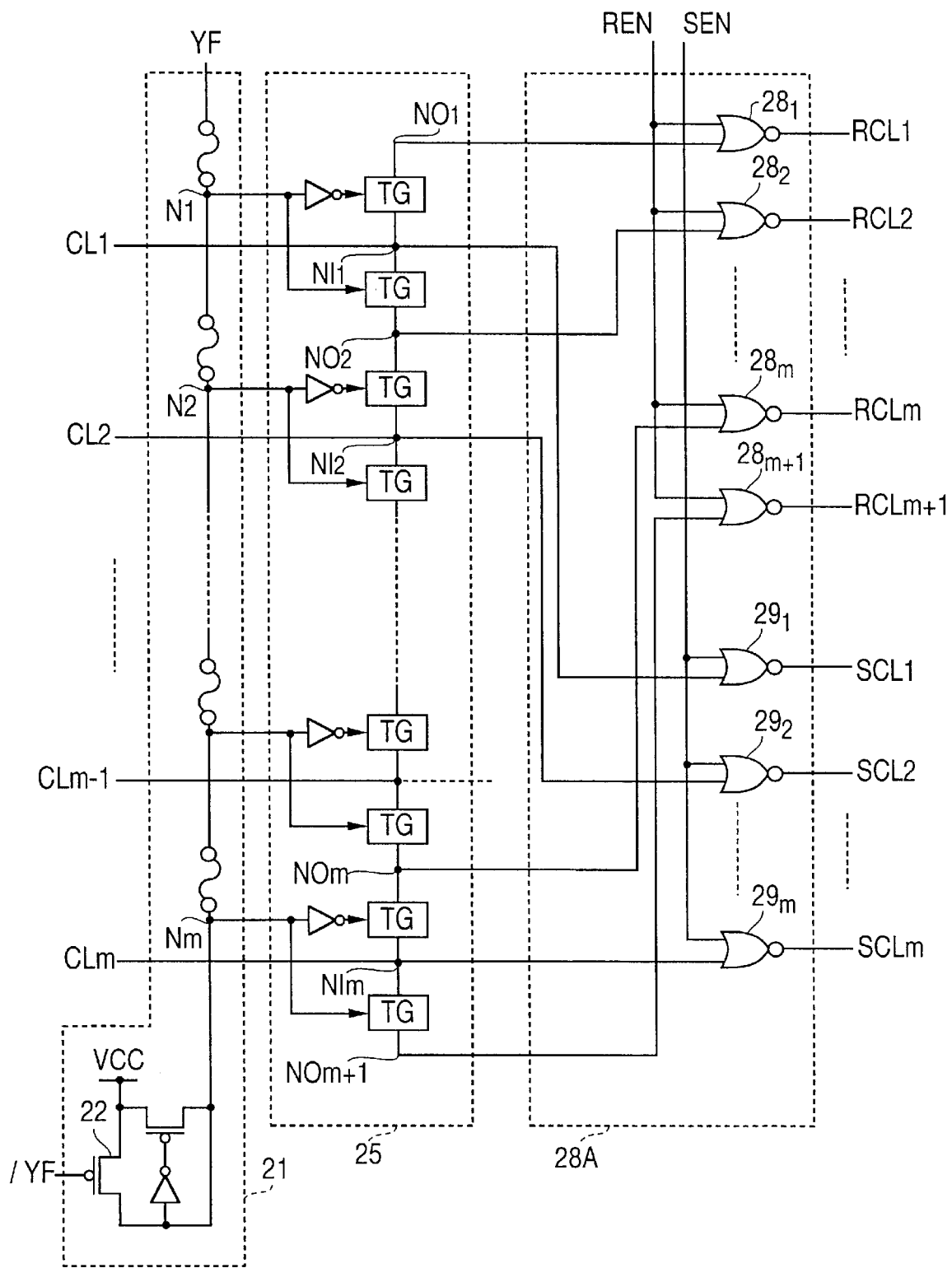
FIG. 7 is a block diagram of the shift redundancy circuit of the fourth preferred embodiment of the present invention.

FIG. 7 is a block diagram of the shift redundancy circuit showing the fourth preferred embodiment of the present invention.

This shift redundancy circuit is utilized instead of the shift redundancy circuit 20 of FIG. 5. In FIG. 7, the common numeral is given to the common element to the elements of FIG. 6.

This shift redundancy circuit includes the switching unit 25 and the setting unit 21 in the same way as FIG. 6 and a driving unit 28A having a component different from FIG. 6.

Namely, the driving unit 28A includes m+1 NORs $28_1$~$28_{m+1}$ which are gate-controlled by the enabling signal REN for the register block and m NORs $29_1$~$29_m$ which are gate-controlled by the enabling signal SEN for the sub-register block. Each second input side of the NORs $28_1$~$28_{m+1}$ is connected to each of the output nodes NO1~NOm+1 of the switching unit 25, and each of the column signals CL1~CLm+1 for the register block is output from each output side of the NORs $28_1$~$28_{m+1}$.

On the other hand, the column signals CL1~CLm are provided directly from the Y decoder circuit 31 to the input side of the NORs $29_1$~$29_m$, and each of the column signals SCL1~SCLm for the sub-register is output from the output side of such NORs $29_1$~$29_m$.

In this shift redundancy circuit, it is possible to separate a failure circuit for the memory cell block 40, the sense amplifier block 60, and the resister block 10R.

In this way, the shift redundancy circuit of the fourth preferred embodiment forms a shift redundancy circuit to the resister block 10R, and also forms a common column decoder circuit to the sub-register block 10S and the resister block 10R. Thus, an advantageous point can be obtained, in which it is possible to simplify the scale of the circuit.

(Fifth Embodiment)

Figure 8:
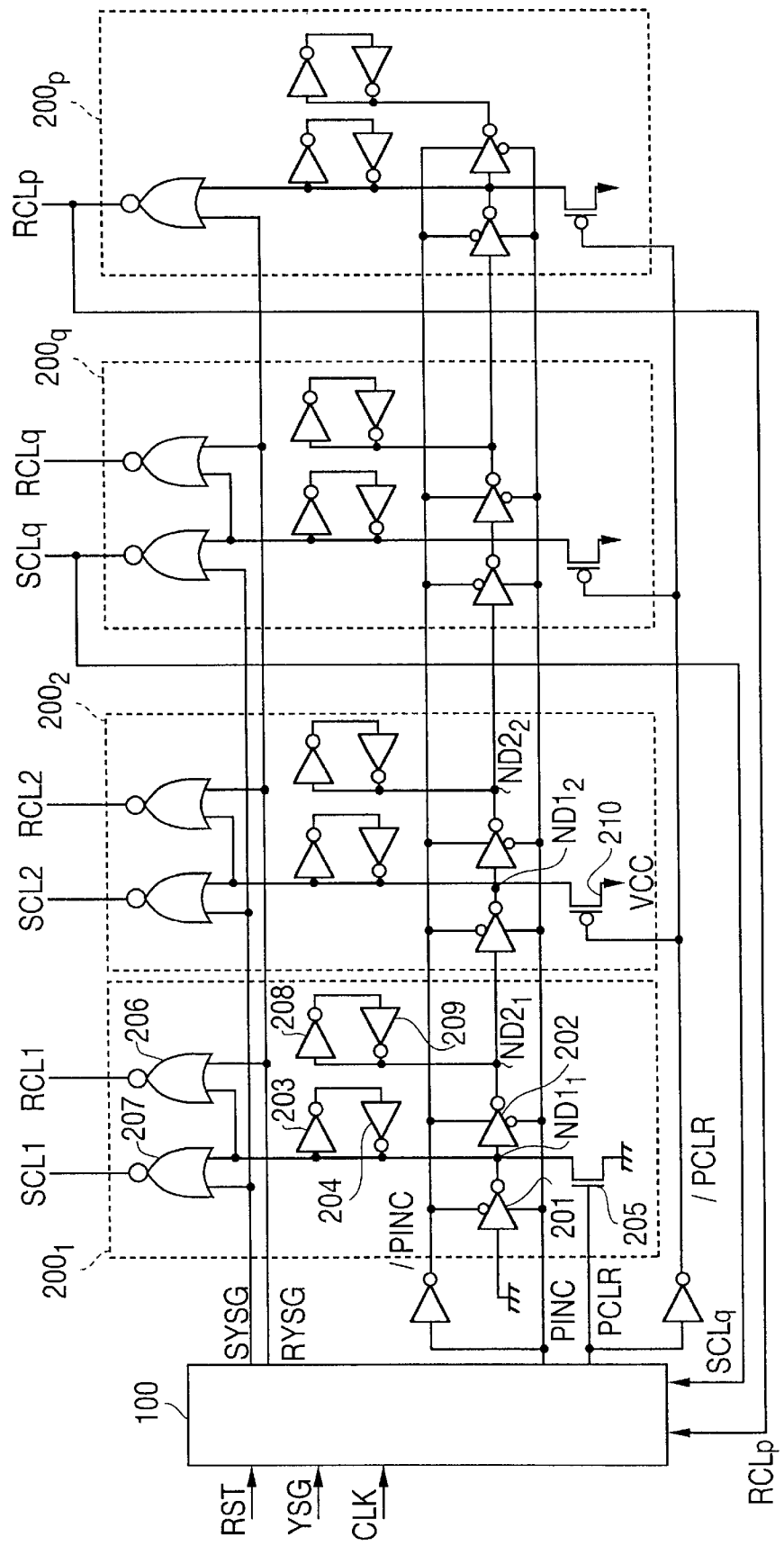
FIG. 8 is a block diagram of a pointer of the fifth preferred embodiment of the present invention.

FIG. 8 is a block diagram of a pointer circuit showing the fifth preferred embodiment of the present invention.

This pointer circuit is used instead of the Y decoder circuit 30 of FIG. 1, for example. In FIG. 8, the case, in which the number (p) of FFs, etc., of the register block is greater than the number (q) of FFs, etc., of the sub-register block, is shown. This pointer circuit is formed from a pointer control circuit 100 and p pointers $200_1 \sim 200_p$.

The pointer control circuit 100 generates a pointer clear signal PCLR, a pointer increment signal PINC, a register enable signal RYSG, and a sub-register enable signal SYSG, based on an enable signal YSG, a clock signal CLK, and a reset signal RST provided from the outside, and the column signal RCLp and the column signal SCLq generated inside.

Each circuit of the pointers $200_1 \sim 200_p$ is almost equal to each other. The pointer $200_1$, for example, includes clocked inverters (hereinafter "CINV") 201 and 202 connected in a series. The pointer increment signal PINC is provided to the clock terminal of CINV 201. A pointer increment signal /PINC inverted by an inverter is provided to the inversion clock terminal. The input side of CINV 201 is connected to a ground electric potential GND, and the output side thereof is connected to a node $ND1_1$.

The input side of CINV 202 is connected to node $ND1_1$, and also inverters 203 and 204, which are connected in a loop manner and form a latch circuit, are connected thereto. Further, an N channel MOS transistor (hereinafter "NMOS") 205, which is controlled by the pointer clear signal PCLR, is connected between the node $ND1_1$ and the ground electric potential GND. Further, each first input side of NORs 206 and 207 is connected to the node $ND1_1$, and each of the register enable signal RYSG and the sub-register enable signal SYSG is provided to each second input side of NORs 206 and 207. Further, each of column signals RCL1 and SCL1 is output from each output side of NORs 206 and 207.

The pointer increment signal /PINC is provided to the clock terminal of CINV 202. The pointer increment signal PINC is provided to the inversion clock terminal. The output side of CINV 202 is connected to the node $ND2_1$. Inverters 208 and 209, which are connected in a loop manner and form a latch circuit, are connected to the node $ND2_1$, and in addition the input side of CINV 201 of the next stage pointers $200_2$ is connected thereto.

The structure of the pointers $200_2 \sim 200_p$ is practically the same as the pointer $200_1$. However, the output side of CINV 201 is connected to the electric power potential VCC using PMOS 210 instead of NMOS 205. This PMOS 210 is structured in order to be controlled by a pointer clear signal /PCLR, which is inverted by the inverter. Further, the column signal SCLq output from NOR 207 of the q-th pointer $200_q$ and the column signal RCLP output from NOR 206 of the p-th pointer $200_p$ are provided to the pointer control circuit 100.

Figure 9:
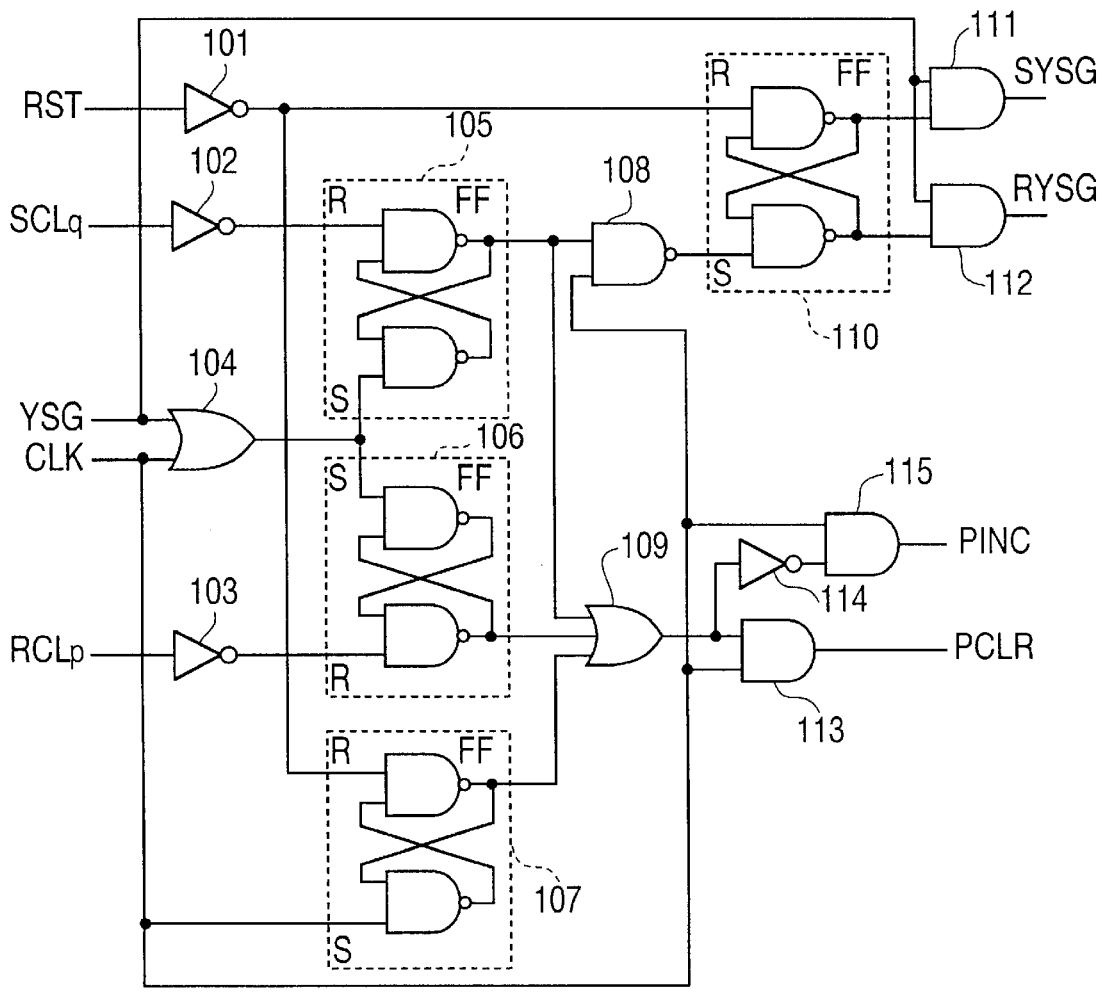
FIG. 9 is a circuit diagram of a pointer control circuit of FIG. 8.

FIG. 9 is a block diagram showing one example of the pointer control circuit of FIG. 8.

The pointer control circuit 100 includes inverters 101, 102, and 103 for inverting the reset signal RST and the column signals SCLq and RCLP respectively and a logical sum gate (hereinafter "OR") 104 for generating the logical sum of the column signal CLk and the enable signal YSG. The output side of OR 104 is connected to a set terminal S of set reset type FFs 105 and 106. Each output side of the inverters 102 and 103 is connected to each reset terminal R of these FFs 105 and 106. Further, the output side of the inverter 101 is connected to a reset terminal R of set reset type FFs 107 and 110.

The output side of FF 105 is connected to the first input side of a two-input negative logical multiplication (hereinafter "NAND") 108 and the first input side of a three-input OR 109. The clock signal CLK is provided to the second input side of NAND 108. The output side of this NAND 108 is connected to the set terminal S of FF 110. The output side and the inversion output side of FF 110 are connected to the first input sides of two-input logical multiplication gates (hereinafter "AND") 111 and 112 respectively. The enable signal YSG is provided to the second input side of each of ANDs 111 and 112. Each of the sub-register enable signal SYSG and the register enable signal RYSG is output from the output side of each of ANDs 111 and 112.

The output sides of FFs 106 and 107 are connected to the second and third input sides of OR 109. The output side of OR 109 is connected to the first input side of a two-input AND 113 and further to the first side of a two-input AND 115 by way of an inverter 114. The clock signal CLK is provided to the second input side of ANDs 113 and 115. The pointer clear signal PCLR and the pointer increment signal PINC are output from the output sides of these ANDs 113 and 115 respectively.

Figure 10:
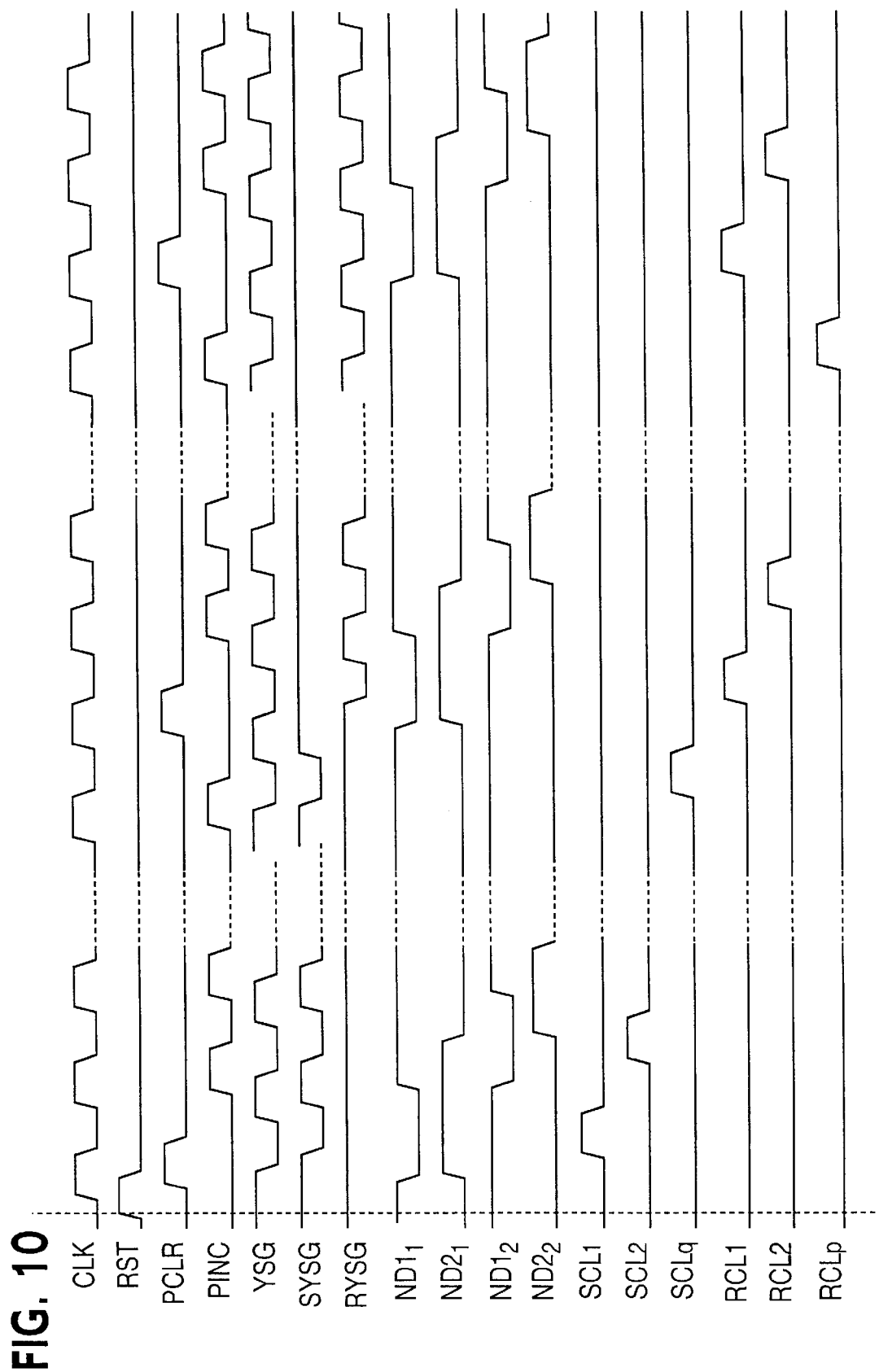
FIG. 10 is a timing chart showing an operational function of FIGS. 8 and 9.

FIG. 10 is a signal wave form showing the operation of FIGS. 8 and 9. The operation of FIGS. 8 and 9 is explained hereinafter with reference to FIG. 10.

Firstly, the operation of the pointer control circuit 100 of FIG. 9 is explained.

When the reset signal RST is input to the pointer control circuit 100, the pointer clear signal PCLR becomes the "H" level by a rising edge of the clock signal CLK and the "L" level by a dropping edge of the clock signal CLK. Further, when the reset signal RST becomes the "L" level, the sub-register enable signal SYSG repeats the "H" level and the "L" level by synchronizing with the enable signal YSG, and the register enable signal RYSG is fixed to the "L" level. The pointer increment signal PINC repeats the "H" level and the "L" level by synchronizing with this clock signal CLK by receiving the rising edge of the next clock signal CLK.

When a one-shot pulse signal is input to a column line SCLq having the last address of the sub-register, the pointer clear signal PCLR becomes the "H" level by receiving the rising edge of the next clock signal CLK and then becomes the "L" level by receiving the dropping edge of the clock signal CLK. In the same way, the sub-register enable signal SYSG is fixed to the "H" level, and the register enable signal RYSG repeats the "H" level and the "L" level by synchronizing with the enable signal YSG by receiving he rising edge of the clock signal CLK. The pointer increment signal PINC becomes the "L" level when the pointer clear signal PCLR is the "H" level, and repeats the "H" level and the "L" level by synchronizing with the clock signal CLK when this pointer clear signal PCLR becomes "the "L" level.

Next, the operation of the pointers $200_1 \sim 200_p$ of FIG. 8 is explained, in such a case that it is performed to read out or write in data which continues from the first address of the sub-register block.

When the pointer clear signal PCLR output from the pointer control circuit 100 becomes the "H" level by accepting the reset signal RST, in the pointers $200_1$, NMOS 205 becomes set to the "ON" condition, and the node $ND1_1$, becomes the "L" level. Further, CINV 202 becomes the operational condition and the node $ND2_1$ is latched to the "H" level.

In the pointer $200_2$, PMOS 210 becomes the ON condition and the node $ND1_2$ becomes the "H" level. Further, CINV 202 becomes the operational condition and the node $ND2_1$ is latched to the "L" level. The same operation as the pointer $200_2$ is also performed in the pointers $200_3 \sim 200_p$, and the nodes $ND1_3 \sim ND1_p$ becomes the "H" level.

Each level of the nodes $ND1_1 \sim ND1_p$ of respective pointers $200_1 \sim 200_p$ is provided to NORs 206 and 207 of each pointer, and the column signals RCLi and SCLi are output in accordance with the register enable signal RYSG and the sub-register enable signal SYSG.

Then, when the pointer increment signal PINC becomes the "H" level, CINV 201 becomes the operational condition. Thus, data having the inverted phase to the ground electric potential GND is sent to the node $ND1_1$, and then the node $ND1_1$, becomes the "H" level, and data having the inverted phase to the node $ND2_1$ is sent to the node $ND1_2$ and then the node $ND1_2$ becomes the "L" level. Further, when the pointer increment signal PINC becomes the "L" level, CINV 202 becomes the operational condition. Thus, data having the inverted phase to the node $ND1_2$ is sent to the node $ND2_1$ and the node $ND2_1$ becomes the "L" level, and data having the inverted phase to the node $ND2_1$ is sent to the node $ND2_2$ and thus the node $ND2_2$ becomes the "H" level.

Accordingly, the column signals SCL1~SCLq output from NOR 207 of respective pointers $200_1 \sim 200_q$ synchronize with the sub-register enable signal SYSG, and then become the "H" level. When the last column signal SCLq becomes the "H" level, each of the pointers $200_1 \sim 200_q$ is reset by the pointer control circuit 100. As a result, the control of write-in or read-out transfers to the register block from the sub-register block.

The register block is controlled in the same way as the above-mentioned sub-register block. Namely, the column signals RCL1~RCLp for the register block become the "H" level sequentially by synchronizing with the "L" level of the register enable signal RYSG. When the last column signal RCLp becomes the "H" level, the pointer clear signal PCLR becomes the "H" level by the pointer control circuit 100, and then each of the pointers $200_1 \sim 200_q$ is reset. At this point, the column signals RCL1~RCLP become the "H" level sequentially by synchronizing with the "L" level of the register enable signal RYSG once more. In this way, the same operation as the Y decoder circuit 30 of FIG. 1 is performed by this pointer circuit.

In such a way, since the pointer circuit of the fifth preferred embodiment has the pointers $200_1 \sim 200_p$ connected in a series, the Y decoder that decodes the column address signal ADY is not required and it is possible to minimize the scale of the circuit. Further, an advantageous point is obtained, in which it is possible to apply to the case where the number of registers of the resister block 10R and the number of the sub-register block 10S is not the same.

Here, the present invention is not limited to the above-mentioned preferred embodiment, but various modifications are possible. As such modifications, the following modifications, for example, are explained.

(a) In the field memory of FIGS. 1, 4 and 5, since the data of the first row is stored in the sub-register block 10S and the data after the second row are stored in the memory cell block 40 through the resister block 10R, the resister block 10R and the sub-register block 10S are structured by the same number of registers. However, the usage classification of the resister block 10R and the sub-register block 10S is not limited to this case. Therefore, it is not necessary that the number of registers of the resister block 10R is the same as the number of registers of the sub-register block 10S.

(b) The concrete structures of the sub-register block 10S, the resister block 10R, the memory cell block 40, and so forth are not limited to the structures of FIGS. 1 and 4. The structure having the same function is applicable in the same way.

(c) The structures of the shift redundancy circuit 20 are not limited to the structures of FIGS. 6 and 7. The structure having the same function is applicable in the same way.

(d) The structures of the pointer circuit of FIG. 8 and the pointer control circuit of FIG. 9 are not limited to the structures of the drawings. The structure having the same function is applicable in the same way.

(e) It is best to apply the present invention to the field memory. Notwithstanding this application, it is applicable to another semiconductor memory device if the structure has the same function.

As explained in detail, the semiconductor device of the present invention includes the register driver for generating the first and second selection signals to the first and second register blocks based on the column address signal and the register enable signal. Thus, it is not required to install the column driver in each of the first and second register blocks and it is possible to simplify the scale of the circuit.

The semiconductor device of the present invention includes the switching unit and the setting unit for setting the register driver by setting the destination of the output of the column selection signal by cutting off the fuse. Thus, even if the column circuit is structured in a redundant manner, it is possible to simplify the scale of the circuit in the same way as the first preferred invention.

The semiconductor device of the present invention includes the column decoder for providing the column selection signal that is common to the first and second register blocks and the first and second register blocks for storing picture data according to the column selection signal when it is designated by the register enabling signal. Thus, it is possible to share the column decoder in the first and second register blocks and it is possible to simplify the scale of the circuit.

The semiconductor device of the present invention includes the pointer circuit for generating the first and second selection signal based on the register enabling signal and the clock signal. Thus, it is not required to provide the circuit for generating the selection signal in each of the first and second register drivers and it is possible to simplify the scale of the circuit.

What is claimed is:

1. A semiconductor device comprising:

a first register for enabling a predetermined part of picture data composed of a plurality of bits to be stored corresponding to a first selection signal;

a memory array cell, which includes a plurality of memory cells being arranged in a matrix way in row and column directions, for storing a residual part of the picture data;

a second register for enabling data being stored in said memory cell array to be output or for enabling data being output from said memory cell array to be stored corresponding to a second selection signal; and a control circuit for selectively generating and outputting the first selection signal or the second selection signal based on position information of the picture data.

2. A semiconductor device according to claim 1, further comprising:

a decoding circuit for decoding address information, wherein the first and second selection signals are generated corresponding to a decoding result in said decoding circuit.

3. A semiconductor device according to claim 2, wherein the first register is formed of a first storing unit for storing the picture data and a first gate circuit for activating corresponding to the first selection signal, and for enabling data stored in the first storing unit to be output or for enabling data to be stored in the first storing unit, and the second register is formed of a second storing unit for storing the picture data and a second gate circuit for activating corresponding to the second selection signal, and for enabling data stored in the second storing unit to be output or for enabling data to be stored in the second storing unit.

4. A semiconductor device according to claim 2, wherein said control circuit includes a redundancy setting unit for enabling shift control information to be set, a switching unit for enabling the decoding result to be input and for enabling the decoding result to be shift-processed based on said shift control information, and a driving unit for generating the first or second selection signal to be generated based on a signal output from the switching unit.

5. A semiconductor device according to claim 4, wherein the first selection signal and the second selection signal are generated based on the same signal among signals output from the switching unit.

6. A semiconductor device according to claim 4, wherein the first selection signal and the second selection signal are generated based on different signals among signals output from the switching unit.

7. A semiconductor device according to claim 1, wherein said semiconductor device is a field memory.

8. A semiconductor device comprising:

a first register for enabling a predetermined part of picture data composed of a plurality of bits to be stored corresponding to decoding information and a first selection signal for indicating position information of the picture data;

a memory array cell, which includes a plurality of memory cells being arranged in a matrix way in row and column directions, for storing a residual part of the picture data;

a second register for enabling data being stored in said memory cell array to be output or for enabling data being output from said memory cell array to be stored corresponding to decoding information and a second selection signal for indicating another position information of the picture data; and a decoding circuit for generating and outputting said decoding information by decoding address information.

9. A semiconductor device according to claim 8, wherein the first register is formed of a first storing unit for storing the picture data and a first gate circuit for activating corresponding to the first selection signal and said decoding information and for enabling data stored in the first storing unit to be output or for enabling data to be stored in the first storing unit, and the second register is formed of a second storing unit for storing the picture data and a second gate circuit for activating corresponding to the second selection signal and said decoding information and for enabling data stored in the second storing unit to be output or for enabling data to be stored in the second storing unit.

10. A semiconductor device according to claim 9, wherein the first gate circuit is formed by connecting in a series a first sub-gate unit for activating corresponding to the first selection signal and the second sub-gate unit for activating corresponding to said decoding information and the second gate circuit is formed by connecting in a series a third sub-gate unit for activating corresponding the second selection signal and the fourth sub-gate unit for activating corresponding to said decoding information.

11. A semiconductor device according to claim 8, wherein said semiconductor device is a field memory.

12. A semiconductor device comprising:

a first register for enabling a predetermined part of picture data composed of a plurality of bits to be stored corresponding to decoding information and a first selection signal for indicating position information of the picture data;

a memory array cell, which includes a plurality of memory cells being arranged in a matrix way in row and column directions, for storing a residual part of the picture data;

a second register for enabling data that is stored in said memory cell array to be output or data being output from said memory cell array to be stored corresponding to said decoding information and a second selection signal for indicating another position information of said picture data; and a control circuit for selectively generating the first selection signal or the second selection signal based on position information of the picture data and for outputting a generated selection signal corresponding to a clock signal synchronizing with the picture data.

13. A semiconductor device according to claim 12, wherein said semiconductor device is a field memory.

* * * * *